(12) United States Patent
Yamaguchi et al.

(10) Patent No.: US 12,454,424 B2
(45) Date of Patent: Oct. 28, 2025

(54) SUBSTRATE TRANSPORT SYSTEM

(71) Applicant: KABUSHIKI KAISHA YASKAWA DENKI, Kitakyushu (JP)

(72) Inventors: Go Yamaguchi, Fukuoka (JP); Yoshiaki Kubota, Fukuoka (JP); Kensuke Oni, Fukuoka (JP)

( * ) Notice: Subject to any disclaimer, the term of this patent is extended or adjusted under 35 U.S.C. 154(b) by 160 days.

(21) Appl. No.: 18/331,179

(22) Filed: Jun. 8, 2023

(65) Prior Publication Data

US 2023/0312271 A1 Oct. 5, 2023

Related U.S. Application Data

(63) Continuation of application No. PCT/JP2021/042090, filed on Nov. 16, 2021.

(30) Foreign Application Priority Data

Dec. 14, 2020 (JP) ................................. 2020-206682

(51) Int. Cl.
*H01L 21/677* (2006.01)
*B65G 47/90* (2006.01)
(Continued)

(52) U.S. Cl.
CPC .......... *B65G 54/02* (2013.01); *B65G 47/904* (2013.01)

(58) Field of Classification Search
USPC ....................................................... 198/619
See application file for complete search history.

(56) References Cited

U.S. PATENT DOCUMENTS

2005/0030503 A1 2/2005 De Weerdt
2010/0327669 A1 12/2010 Toyota et al.
(Continued)

FOREIGN PATENT DOCUMENTS

JP 06324297 A * 11/1994
JP H6-324297 11/1994
(Continued)

OTHER PUBLICATIONS

International Search Report dated Feb. 1, 2022 for PCT/JP2021/042090.
(Continued)

*Primary Examiner* — Gene O Crawford
*Assistant Examiner* — Muhammad Awais
(74) *Attorney, Agent, or Firm* — SOEI PATENT & LAW FIRM

(57) ABSTRACT

A substrate transport system comprises: a linear transport device configured to transport a substrate along a transport line; and a robot configured to receive the substrate from the linear transport device, load the substrate into a processing unit, unload the substrate from the processing unit, and deliver the substrate to the linear transport device, wherein the linear transport device comprises: a first moving body configured to move along the transport line; a second moving body configured to support the substrate; and a non-contact force generator configured to apply a non-contact force to the second moving body from the first moving body to cause the second moving body to follow movement of the first moving body while levitating, by the non-contact force, the second moving body with respect to the first moving body.

20 Claims, 9 Drawing Sheets

(51) Int. Cl.
    *B65G 49/06*    (2006.01)
    *B65G 54/02*    (2006.01)

(56) References Cited

U.S. PATENT DOCUMENTS

| | | | |
|---|---|---|---|
| 2011/0096306 A1 | 4/2011 | Yoshimoto | |
| 2011/0123913 A1 | 5/2011 | Yoshimoto | |
| 2016/0218029 A1* | 7/2016 | Janakiraman | H01L 21/67709 |
| 2020/0111692 A1* | 4/2020 | Newman | H01L 21/67715 |

FOREIGN PATENT DOCUMENTS

| | | |
|---|---|---|
| JP | 2842559 | 1/1999 |
| JP | 2842559 B2 * | 1/1999 |
| JP | 2003-168716 | 6/2003 |
| JP | 2003168716 A * | 6/2003 |
| JP | 2008-028179 | 2/2008 |
| JP | 4484621 | 6/2010 |
| JP | 2013-506270 | 2/2013 |
| JP | 2013-511822 | 4/2013 |
| JP | 5387570 | 1/2014 |
| JP | 2018-504784 | 2/2018 |
| WO | 2009/128321 | 10/2009 |
| WO | 2011/037278 | 3/2011 |
| WO | 2011/062296 | 5/2011 |
| WO | 2013/031222 | 3/2013 |
| WO | 2016/118335 | 7/2016 |

OTHER PUBLICATIONS

Office Action issued in Japanese Patent Application No. P2022-569793, dated Jul. 23, 2024 (with English partial translation).
International Preliminary Report on Patentability with Written Opinion dated Jun. 29, 2023 for PCT/JP2021/042090.
Office Action issued in Korean Patent Application No. 10-2023-7020268 dated Jan. 31, 2025 (with English partial translation).
Office Action issued in Japanese Patent Application No. P2022-569793, dated Jan. 7, 2025 (with English partial translation).

* cited by examiner

SUBSTRATE TRANSPORT SYSTEM

CROSS-REFERENCE TO RELATED APPLICATIONS

This application is a continuation application of PCT Application No. PCT/JP2021/042090, filed on Nov. 16, 2021, which claims the benefit of priority from Japanese Patent Application No. 2020-206682, filed on Dec. 14, 2020. The entire contents of the above listed PCT and priority applications are incorporated herein by reference.

BACKGROUND

Field

The present disclosure relates to a substrate transport system and a substrate transport device.

Description of the Related Art

Japanese Unexamined Patent Publication No. 2008-028179 discloses a substrate processing apparatus in which a substrate is transported by a mobile robot that moves in a transport chamber by being driven by a linear motor.

SUMMARY

Disclosed herein is a substrate transport system. The substrate transport system may comprise: a linear transport device configured to transport a substrate along a transport line; and a robot configured to receive the substrate from the linear transport device, load the substrate into a processing unit, unload the substrate from the processing unit, and deliver the substrate to the linear transport device, wherein the linear transport device comprises: a first moving body configured to move along the transport line; a second moving body configured to support the substrate; and a non-contact force generator configured to apply a non-contact force to the second moving body from the first moving body to cause the second moving body to follow movement of the first moving body while levitating, by the non-contact force, the second moving body with respect to the first moving body.

Additionally, a substrate transport device is disclosed herein. The substrate transport device may comprise: a first moving body configured to move along a transport line; a second moving body configured to support a substrate; and a non-contact force generator configured to generate a non-contact force between the first moving body and the second moving body to cause the second moving body to follow movement of the first moving body while levitating, by the non-contact force, the second moving body with respect to the first moving body, wherein the non-contact force generator comprises: a first actuator that faces the second moving body along a first intersecting line intersecting the transport line and is configured to apply a first parallel non-contact force parallel to the second moving body; and a second actuator that faces the second moving body along a second intersecting line intersecting the transport line and the first intersecting line and is configured to apply a second parallel non-contact force parallel to the second moving body.

DETAILED DESCRIPTION

In the following description, with reference to the drawings, the same reference numbers are assigned to the same components or to similar components having the same function, and overlapping description is omitted.

Substrate Transport System

Figure 1:
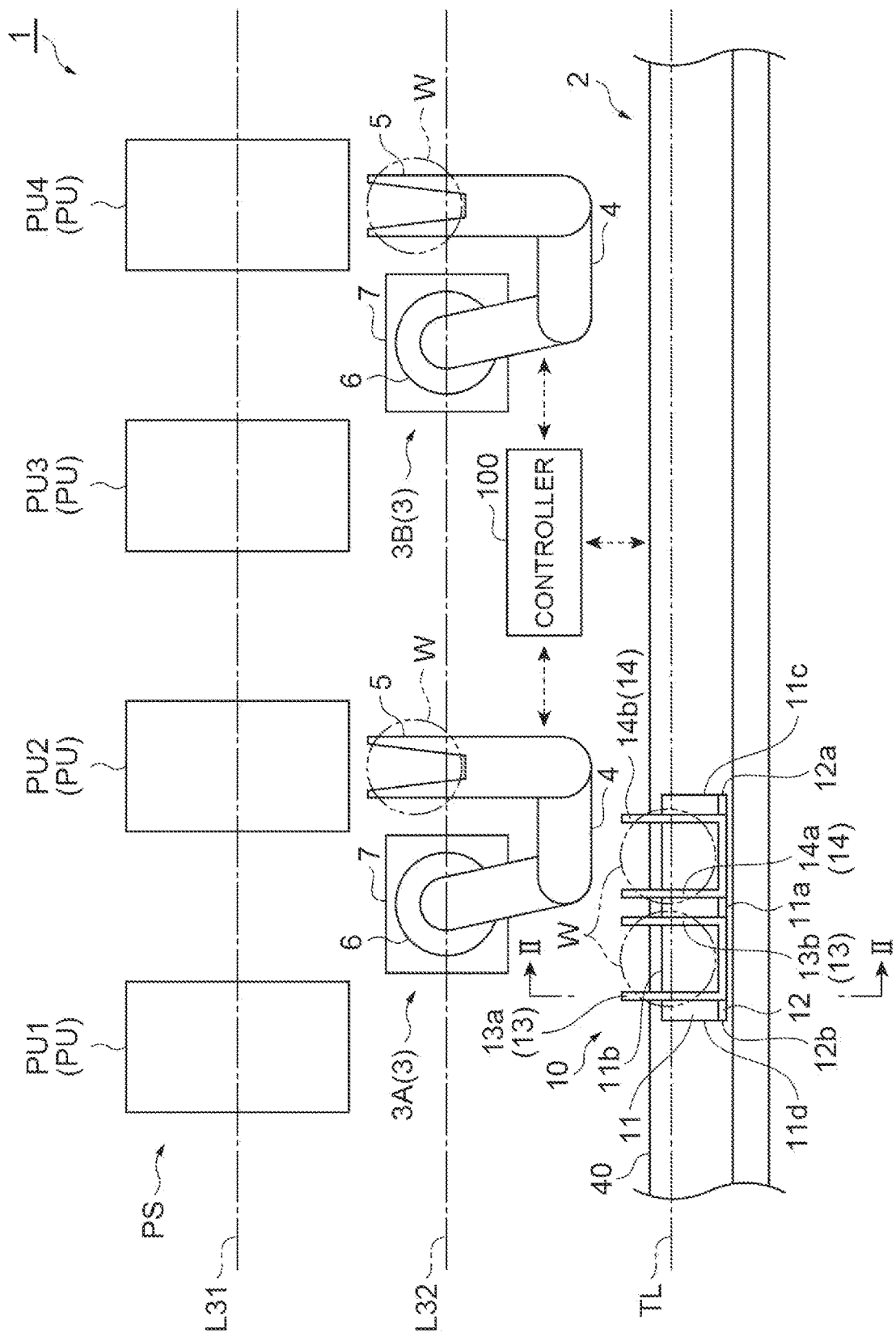
FIG. 1 is a diagram illustrating a schematic configuration of an example substrate transport system.

A substrate transport system 1 illustrated in FIG. 1 is a system for conveying substrate to be processed in a substrate processing system PS. Examples of the substrate to be processed include a semiconductor substrate, a glass substrate, a mask substrate, and an FPD (Flat Panel Display) substrate.

The substrate transport system 1 includes a linear transport device 2, a robot 3, and a controller 100. The linear transport device 2 (substrate transport device) transports a substrate W to be processed along a transport line. The robot 3 receives the substrate W from the linear transport device 2, loads it into a processing unit PU in the substrate processing system PS, unloads the substrate W from the processing unit PU and delivers it to the linear transport device 2. The controller 100 controls the linear transport device 2 and the robot 3.

The robot 3 includes a base 7, a hand 5, an articulated arm 4, and a lifting drive unit 6. The base 7 is fixed between the processing unit PU and the linear transport device 2. The hand 5 supports the substrate W substantially horizontally. The articulated arm 4 changes the position and posture of the hand 5 with respect to the base 7 along a horizontal plane. The lifting drive unit 6 raises and lowers the articulated arm 4 and the hand 5 with respect to the base 7.

The substrate processing system PS may include a plurality of processing units PU. Correspondingly, the substrate transport system 1 may include a plurality of robots 3. For example, the substrate processing system PS includes a plurality of processing units PU arranged along a horizontal a unit array line L31. The substrate transport system 1 includes a plurality of robots 3 arranged along a robot array line L32 parallel to the unit array line L31.

Although four processing units PU and two robots 3 are illustrated in FIG. 1, the number of the processing unit PU and the number of the robot 3 are not limited thereto. As an example, the substrate transport system 1 includes four processing units PU1, PU2, PU3, PU4 and two robots 3A, 3B. The processing units PU1, PU2, PU3, PU4 are arranged along the unit array line L31.

The base 7 of the robot 3A is arranged to correspond to the processing units PU1, PU2 and the base 7 of the robot 3B is arranged to correspond to the processing units PU3, PU4.

The robot 3A receives the substrate W from the linear transport device 2, loads it into the processing unit PU1 or the processing unit PU2, unloads the substrate W from the processing unit PU1 or the processing unit PU2, and delivers it to the linear transport device 2. The robot 3B receives the substrate W from the linear transport device 2, loads it into the processing unit PU3 or the processing unit PU4, unloads the substrate W from the processing unit PU3 or the processing unit PU4, and delivers it to the linear transport device 2.

The linear transport device 2 moves a floating unit supporting the substrate W along a transport line TL in a floating state. Although a case where the transport line TL is horizontal will be described below, the transport line TL may be inclined with respect to the horizontal.

The linear transport device 2 is provided so that the robot array line L32 is located between the linear transport device 2 and the unit array line L31 when viewed from above, and moves the floating unit along the transport line TL parallel to the unit array line L31 and the robot array line L32. For example, the linear transport device 2 includes a floating unit 10 and a drive unit 40.

The floating unit 10 (second moving body) includes a bottom frame 11, a side frame 12, a first support 13, and a second support 14. The bottom frame 11 constitutes the bottom of the floating unit 10. The bottom frame 11 includes side edges 11a, 11b along a longitudinal direction and end edges 11c, 11d along a short direction. The floating unit 10 is placed substantially horizontally on the drive unit 40 so that the side edges 11a, 11b are along the transport line TL. Viewed from above, the side edge 11a is located opposite the robot array line L32 with respect to the side edge 11b.

Figure 2:
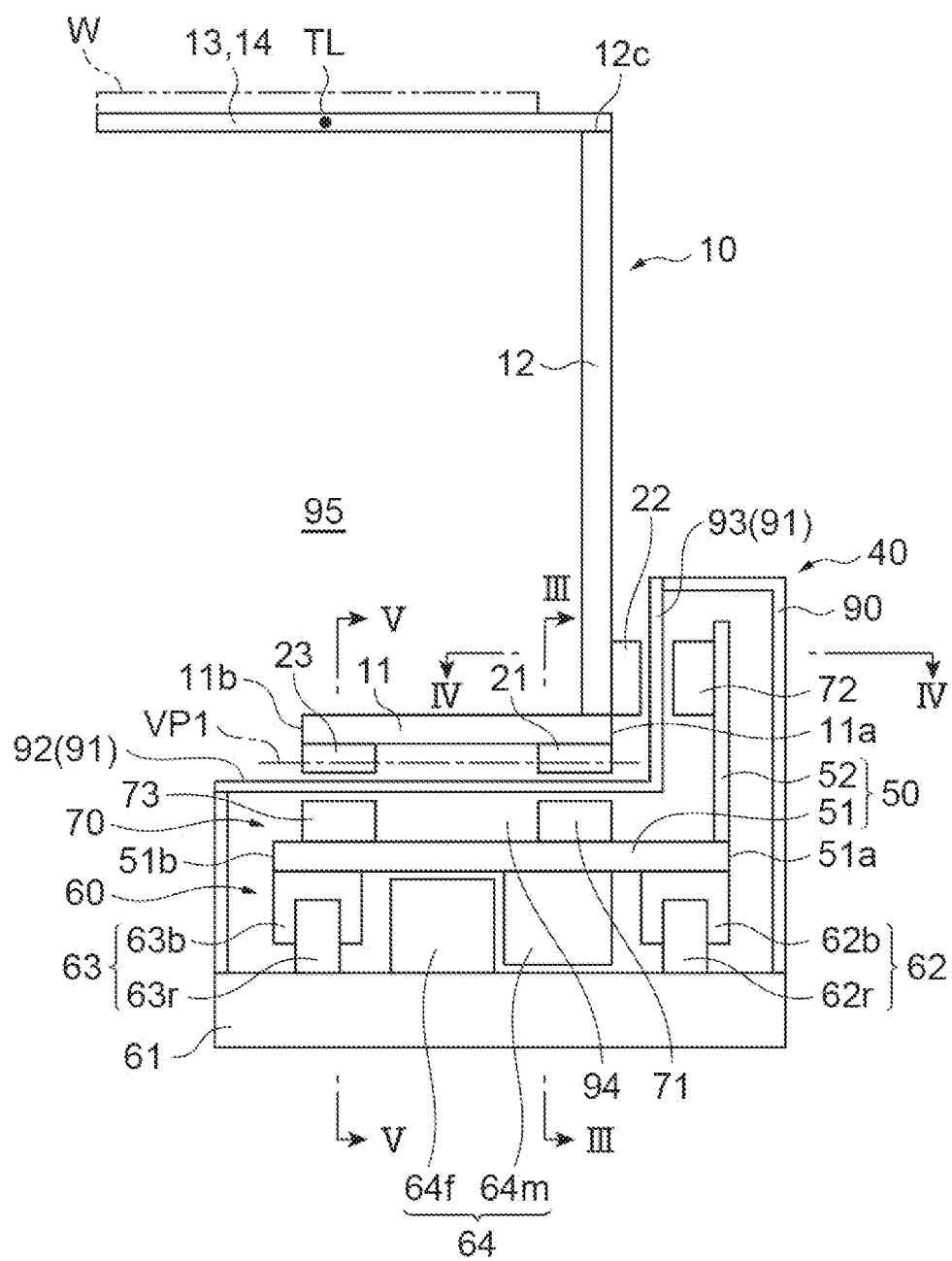
FIG. 2 is a sectional view taken along a line II-II in FIG. 1.

As illustrated in FIG. 2, the side frame 12 extends upward from the side edge 11a of the bottom frame 11 and constitutes the side of the floating unit 10. The side frame 12 includes an end edge 12a facing in the same direction as the end edge 11c, an end edge 12b facing in the same direction as the end edge 11d, and an upper edge 12c. The first support 13 and the second support 14 are fixed to the upper edge 12c of the side frame 12 so as to line up along the transport line TL and each support the substrate W.

The first support 13 includes support beams 13a, 13b that line up along the transport line TL. Each of the support beams 13a, 13b protrudes from the upper edge 12c of the side frame 12 towards the robot array line L32 and supports the substrate W above the bottom frame 11. With respect to the side frame 12, the support beams 13a, 13b extend farther than the side edge 11b of the bottom frame 11. The spacing between the support beams 13a, 13b is greater than the width of the hand 5. Therefore, the hand 5 can support the substrate W between the support beams 13a, 13b.

The second support 14 includes support beams 14a, 14b that line up along the transport line TL. Each of the support beams 14a, 14b protrudes from the upper edge 12c of the side frame 12 to span above the bottom frame 11 and support the substrate W. With respect to the side frame 12, the support beams 14a, 14b extend farther than the side edge 11b of the bottom frame 11. The spacing between the support beams 14a, 14b is greater than the width of the hand 5. Therefore, the hand 5 can support the substrate W between the support beams 14a, 14b.

Figure 3:
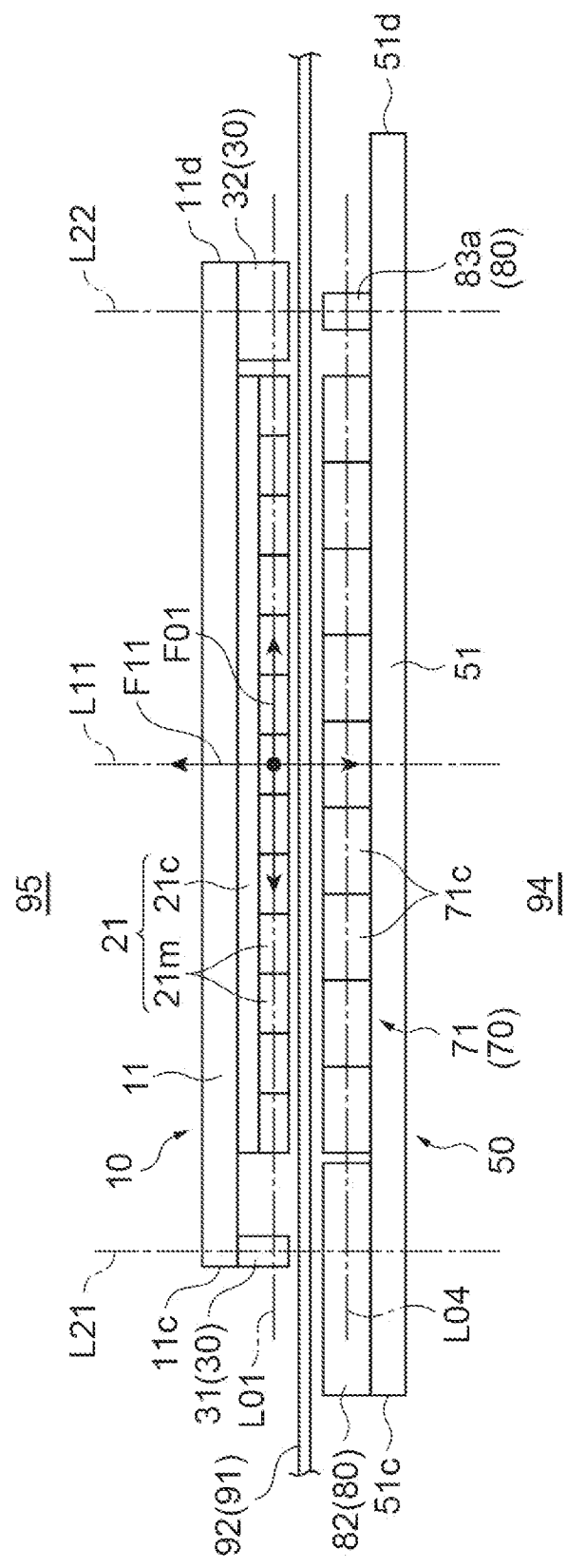
FIG. 3 is a sectional view taken along a line III-III in FIG. 2.

The floating unit 10 includes a first mover 21 and a second mover 22. The first mover 21 and the second mover 22 are portions on which non-contact force due to the drive unit 40 acts. As illustrated in FIG. 3, at least a first non-contact force F01 parallel to the transport line TL acts on the first mover 21. For example, the first mover 21 is fixed to a lower surface of a portion close to the side edge 11a in the bottom frame 11. The first mover 21 includes a plurality of permanent magnets 21m arranged along an array line L01 parallel to the transport line TL and a yoke 21c holding the permanent magnets 21m. The first non-contact force F01 acts on the first mover 21 along the array line L01.

Figure 4:
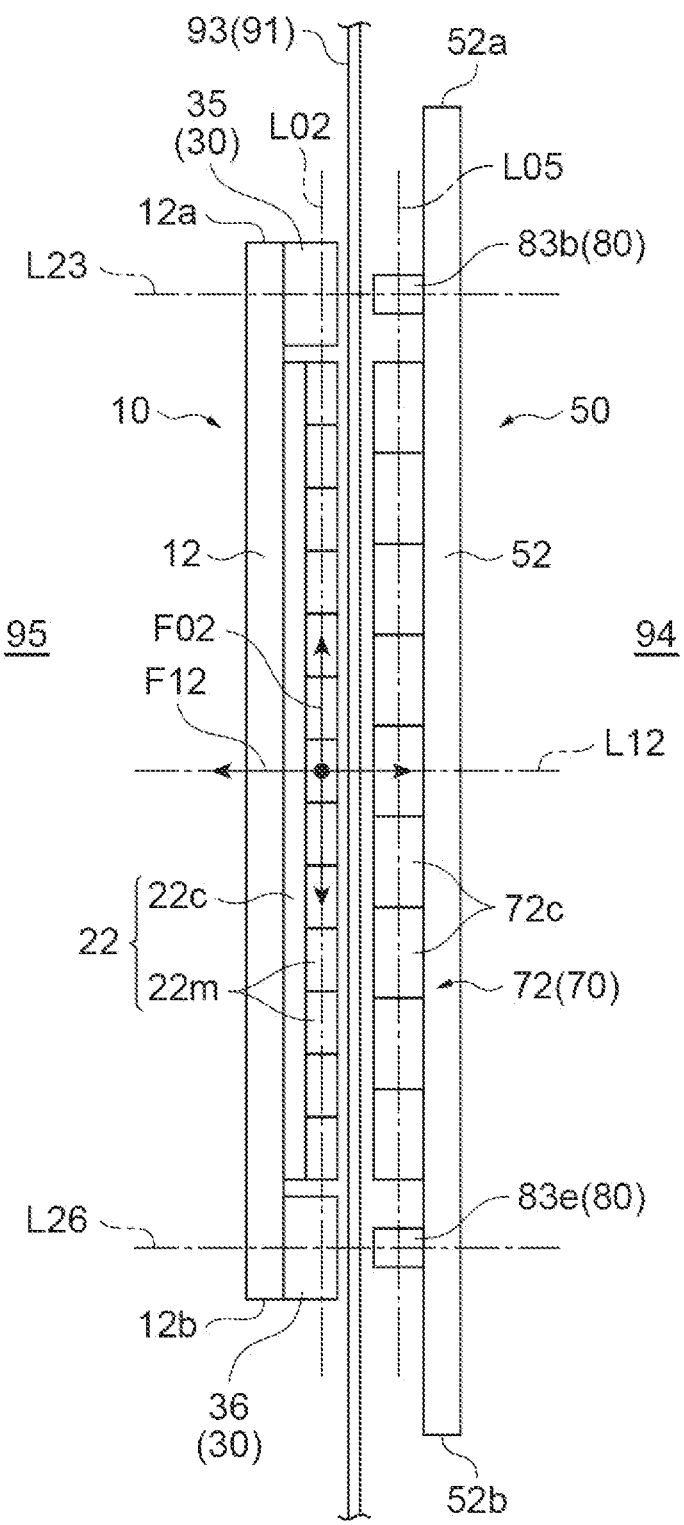
FIG. 4 is a sectional view taken along a line IV-IV in FIG. 2.

As illustrated in FIG. 4, at least a second non-contact force F02 parallel to the transport line TL acts on the second mover 22. For example, the second mover 22 is fixed to an outer surface of the side frame 12. The outer surface of the side frame 12 is the surface facing away from the direction in which the first support 13, the second support 14 and the bottom frame 11 extend from the side frame 12 (the direction toward the robot array line L32). The second mover 22 includes a plurality of permanent magnets 22m arranged along an array line L02 parallel to the transport line TL and a yoke 22c holding the permanent magnets 22m. The second non-contact force F02 acts on the second mover 22 along the array line L02.

Figure 5:
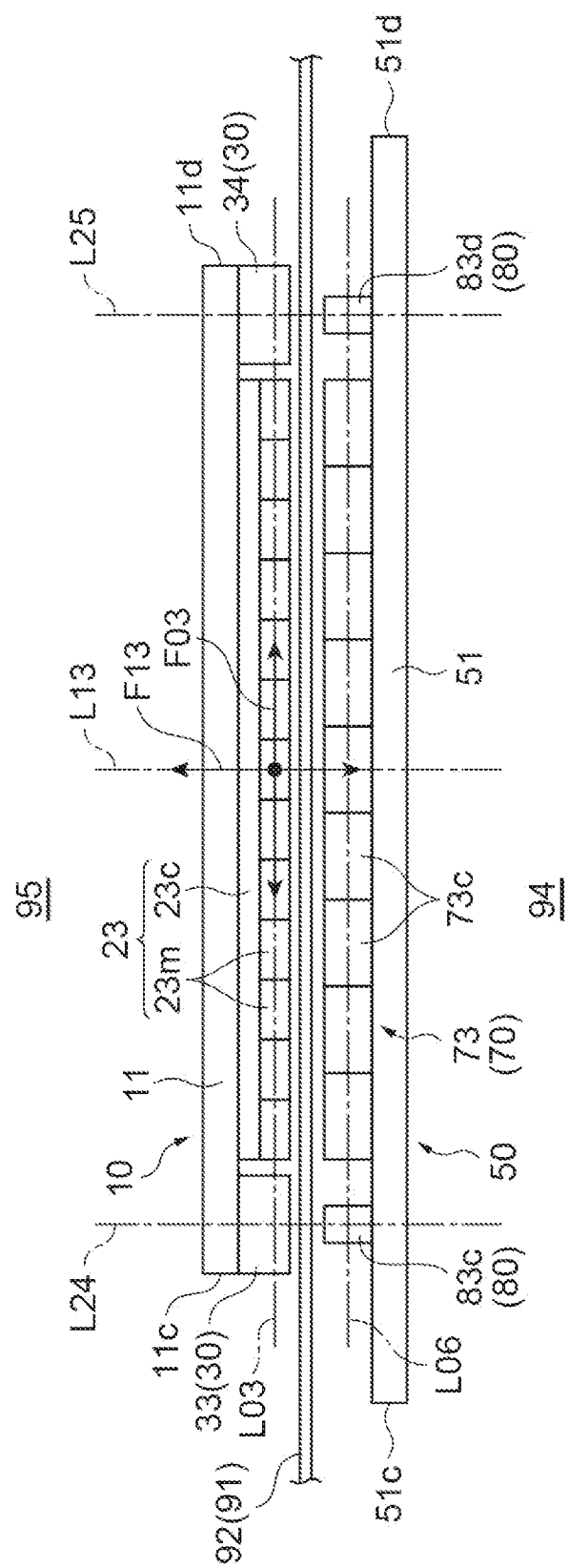
FIG. 5 is a sectional view taken along a line V-V in FIG. 2.

The floating unit 10 may further include a third mover 23. The third mover 23 is also a portion on which a non-contact force due to the drive unit 40 acts. As illustrated in FIG. 5, at least a third non-contact force F03 parallel to the transport line TL acts on the third mover 23. For example, the third mover 23 is fixed to a lower surface of a portion close to the side edge 11b in the bottom frame 11. The third mover 23 includes a plurality of permanent magnets 23m arranged along an array line L03 parallel to the transport line TL and a yoke 23c holding the permanent magnets 23m. The third non-contact force F03 acts on the third mover 23 along the array line L03. In this configuration, the second mover 22 is spaced upwardly from a virtual plane VP1 that includes the array line L01 and the array line L03.

The floating unit 10 further includes at least one positioning target 30 whose displacement is to be detected. For example, the at least one positioning target 30 includes a first positioning target 31, a second positioning target 32, a third positioning target 33, a fourth positioning target 34, a fifth positioning target 35, and a sixth positioning target 36.

The first positioning target 31 is fixed to the lower surface of the portion of the bottom frame 11 between the end edge 11c and the first mover 21. For example, the first positioning target 31 is a positioning target of a linear sensor 82 described later, and includes magnets for generating magnetostriction. The second positioning target 32 is fixed to the lower surface of the portion of the bottom frame 11 between the end edge 11d and the first mover 21. For example, the second positioning target 32 is a positioning target of a gap sensor 83a described later, and includes a conductive member through which eddy current flows.

The third positioning target 33 is fixed to the lower surface of the portion of the bottom frame 11 between the end edge 11c and the third mover 23. For example, the third positioning target 33 is a positioning target of a gap sensor 83c described later, and includes a conductive member through which eddy current flows. The fourth positioning target 34 is fixed to the lower surface of the portion of the bottom frame 11 between the end edge 11d and the third mover 23. For example, the fourth positioning target 34 is a positioning target of a gap sensor 83d described later, and includes a conductive member through which eddy current flows.

The fifth positioning target 35 is fixed to the outer surface of the side frame 12 between the end edge 12a and the second mover 22. For example, the fifth positioning target 35 is a positioning target of a gap sensor 83b described later, and includes a conductive member through which eddy current flows. The sixth positioning target 36 is fixed to the outer surface of the side frame 12 between the end edge 12b and the second mover 22. For example, the sixth positioning target 36 is a positioning target of a gap sensor 83e described later, and includes a conductive member through which eddy current flows.

The drive unit 40 moves the floating unit 10 in a floating state. For example, the drive unit 40 includes a moving base 50, a base drive unit 60, a non-contact force generation unit 70, a position/posture detection unit 80, and a housing 90.

The moving base 50 (first moving body) is located below the floating unit 10 and moves along the transport line TL. The moving base 50 includes a bottom plate 51 and a side plate 52.

The bottom plate 51 constitutes the bottom of the moving base 50. The bottom plate 51 includes side edges 51a, 51b along the longitudinal direction and end edges 51c, 51d along the short direction. The bottom plate 51 is arranged substantially horizontally such that the side edge 51a is oriented in the same direction as the side edge 11a of the bottom frame 11, the side edge 51b is oriented in the same direction as the side edge 11b of the bottom frame 11, the end edge 51c is oriented in the same direction as the end edge 11c of the bottom frame 11, and the end edge 51d is oriented in the same direction as the end edge 11d of the bottom frame 11.

The side plate 52 extends upward from the side edge 51a of the bottom plate 51 and constitutes the side of the moving base 50. The side plate 52 includes an end edge 52a facing in the same direction as the end edge 51c and an end edge 52b facing in the same direction as the end edge 51d.

The base drive unit 60 moves the moving base 50 along the transport line TL. The base drive unit 60 includes a base stage 61, linear guides 62, 63, and a linear actuator 64. The base stage 61 extends along the transport line TL below the moving base 50.

The linear guides 62, 63 guide the moving base 50 to move parallel to the transport line TL. The linear guides 62, 63 are aligned in a direction perpendicular to the transport line TL. A linear guide 62 includes a rail 62r and a block 62b. The rail 62r extends parallel to the transport line TL below a portion of the bottom plate 51 closer to the side edge 51a and is fixed to the upper surface of the base stage 61. The block 62b is fixed to a lower surface of a portion of the bottom plate 51 closer to the side edge 51a. The block 62b is attached to the rail 62r via rolling elements such as balls so as to be able to move parallel to the transport line TL.

A linear guide 63 has a rail 63r and a block 63b. The rail 63r extends parallel to the transport line TL below a portion of the bottom plate 51 closer to the side edge 51b and is fixed to the upper surface of the base stage 61. The block 63b is fixed to a lower surface of a portion of the bottom plate 51 closer to the side edge 51b. The block 63b is attached to the rail 63r via rolling elements such as balls so as to be able to move parallel to the transport line TL.

The linear actuator 64 includes a stator 64f and a mover 64m. The mover 64m is fixed to the lower surface of the bottom plate 51 between the block 62b and the block 63b. The stator 64f extends parallel to the transport line TL while facing the mover 64m and is fixed to the upper surface of the base stage 61. The stator 64f applies a thrust to the mover 64m along the transport line TL.

As an example, the mover 64m may have at least one permanent magnet. The stator 64f includes a plurality of coils arranged along a direction parallel to the transport line TL, and generates a moving magnetic field moving parallel to the transport line TL in response to supply of electric power. The thrust acts on the mover 64m by the moving magnetic field and the magnetic field of the permanent magnet.

The configuration of the linear actuator 64 is not particularly limited as long as thrust parallel to the transport line TL can be applied to the moving base 50, and can be modified. For example, the linear actuator 64 may be configured to apply thrust on the moving base 50 by a rotary motor and a ball screw.

The non-contact force generation unit 70 applies a non-contact force to the floating unit 10 from the moving base 50 to cause the floating unit 10 to follow the movement of the moving base 50 while levitating the floating unit 10 with respect to the moving base 50.

The non-contact force refers to a force acting between two objects even if the two objects are not in contact with each other. Examples of the non-contact force include magnetic force, gravity, Coulomb force, and the like. For example, the non-contact force generation unit 70 generates a magnetic force from the moving base 50 to the floating unit 10. The non-contact force generation unit 70 may be configured to change the position of the floating unit 10 relative to the moving base 50, at least along the transport line TL. The non-contact force generation unit 70 may be configured to change the posture of the floating unit 10 relative to the moving base 50. Although the non-contact force may not act in a concentrated manner at one point, the "non-contact force" in the following description refers to a force representing a set of non-contact forces as a force concentrated at one point of action.

The non-contact force generation unit 70 may be configured to generate six non-contact forces between the moving base 50 and the floating unit 10 that are independent of one another. Here, that three or more non-contact forces are independent of each other means that in the three or more non-contact forces, each non-contact force cannot be synthesized by the remaining two or more non-contact forces. Examples of the case where three or more non-contact forces are not independent of each other include a case where three non-contact forces are parallel to each other in the same plane. One of the three non-contact forces may be substituted by adjusting magnitudes of other two of the three non-contact forces.

The non-contact force generation unit 70 may include at least one actuator, and the at least one actuator may include one actuator that generates two or more non-contact forces of the six non-contact forces. As an example, the non-contact force generation unit 70 includes a first actuator 71 and a second actuator 72.

The first actuator 71 faces the floating unit 10 along a first intersecting line that intersects (for example, is orthogonal to) the transport line TL and applies a non-contact force to the floating unit 10. The "intersecting" also includes a case where there is a twisted relationship such as so-called three-dimensional intersection. The same applies to the following description. The first actuator 71 may apply a first non-contact force parallel to the transport line TL to the floating unit 10. The first actuator 71 may further apply a first intersecting non-contact force along the first intersecting line to the floating unit 10.

The first actuator 71 may be provided to face the floating unit 10 from below. For example, the first actuator 71 is fixed to an upper surface of a portion close to the side edge 51a in the bottom plate 51, and faces the first mover 21 from below along a vertical intersecting line L11 (first intersecting line) that is orthogonal to the transport line TL. The first actuator 71 applies the first non-contact force F01 parallel to the transport line TL and along the array line L01 to the first mover 21 and further applies a first intersecting non-contact force F11 along the intersecting line L11 to the first mover 21.

The first actuator 71 may be a linear motor that displaces the floating unit 10 along the transport line TL. For example, the first actuator 71 includes a plurality of coils 71c arranged along an array line L04 parallel to the transport line TL. The coils 71c generate a moving magnetic field that moves parallel to the transport line TL along the array line L01 in response to the supply of electric power. The first non-contact force F01 and the first intersecting non-contact force F11 act on the first mover 21 by the moving magnetic field and the magnetic field of the permanent magnets 21m of the first mover 21.

The second actuator 72 faces the floating unit 10 along a second intersecting line that intersects (for example, is orthogonal to) the transport line TL and the intersecting line L11 and applies a non-contact force to the floating unit 10. The second actuator 72 may apply a second non-contact force parallel to the transport line TL to the floating unit 10. The second actuator 72 may further apply a second intersecting non-contact force along the second intersecting line to the floating unit 10.

The second actuator 72 may be provided so as to face the floating unit 10 from a direction opposite to a direction in which the robot 3 is disposed with respect to the linear transport device 2. For example, the second actuator 72 is fixed to the inner surface of the side plate 52. The inner surface of the side plate 52 is a surface facing a direction in which the bottom plate 51 protrudes from the side plate 52 (a surface facing the robot array line L32). The inner surface of the side plate 52 faces the outer surface of the side frame 12. The second actuator 72 faces the second mover 22 along a horizontal intersecting line L12. The second actuator 72 applies the second non-contact force F02 parallel to the transport line TL and along the array line L02 to the second mover 22 and further applies a second intersecting non-contact force F12 along the intersecting line L12 to the second mover 22.

The second actuator 72 may be a linear motor that displaces the floating unit 10 along the transport line TL. For example, the second actuator 72 includes a plurality of coils 72c arranged along an array line L05 parallel to the transport line TL. The coils 72c generate a moving magnetic field that moves parallel to the transport line TL along the array line L02 in response to the supply of electric power. The second non-contact force F02 and the second intersecting non-contact force F12 act on the second mover 22 by the moving magnetic field and the magnetic field of the permanent magnets 22m of the second mover 22.

The non-contact force generation unit 70 may further include a third actuator 73. The third actuator 73 faces the floating unit 10 along a third intersecting line that intersects (for example, is orthogonal to) the second intersecting line and is parallel to the first intersecting line, and applies a non-contact force to the floating unit 10. The third actuator 73 may apply a third non-contact force to the floating unit 10 parallel to the transport line TL. The third actuator 73 may further apply a third intersecting non-contact force along the third intersecting line to the floating unit 10.

The third actuator 73 may be provided to face the floating unit 10 from below. For example, the third actuator 73 is fixed to an upper surface of a portion of the bottom plate 51 close to the side edge 51b, and faces the third mover 23 from below along a vertical an intersecting line L13 (third intersecting line) that is orthogonal to the transport line TL. The third actuator 73 applies the third non-contact force F03 parallel to the transport line TL and along the array line L03 to the third mover 23 and further applies a third intersecting non-contact force F13 along the intersecting line L13 to the third mover 23.

The third actuator 73 may be a linear motor that displaces the floating unit 10 along the transport line TL. For example, the third actuator 73 includes a plurality of coils 73c arranged along an array line L06 parallel to the transport line TL. The coils 73c generate a moving magnetic field that moves parallel to the transport line TL along the array line L03 in response to the supply of electric power. The third non-contact force F03 and the third intersecting non-contact force F13 act on the third mover 23 by the moving magnetic field and the magnetic field of the permanent magnets 23m of the third mover 23.

The first actuator 71 and the third actuator 73 may be configured to generate a greater non-contact force compared to the second actuator 72. As an example, the number of the coils 71c of the first actuator 71 is greater than the number of the coils 72c of the second actuator 72. The number of the coils 73c of the third actuator 73 is also greater than the number of the coils 72c of the actuator 72. Correspondingly, the first actuator 71 is longer than the second actuator 72, and the third actuator 73 is longer than the second actuator 72.

Also, the number of the permanent magnets 21m of the first mover 21 is greater than the number of the permanent magnets 22m of the second mover 22. The number of the permanent magnets 23m of the third mover 23 is also greater than the number of the permanent magnets 22m of the second mover 22. Correspondingly, the first mover 21 is longer than the second mover 22, and the third mover 23 is longer than the second mover 22.

The position/posture detection unit 80 detects the relative position and relative posture of the floating unit 10 with respect to the moving base 50 without contact. The position/posture detection unit 80 may be configured to detect displacement of the floating unit 10 along six positioning lines that are independent of one another without contact.

Here, the relation that three or more positioning lines are independent of each other means that in the three or more positioning lines, a vector along each of the positioning lines cannot be synthesized by vectors along the remaining two or more positioning lines. Note that the vector along the positioning line means a vector along the positioning line and located on the positioning line.

As an example of the case where three or more positioning lines are not independent of each other, there is a case where three positioning lines are parallel to each other in the same plane. A vector along one of the three positioning lines may be synthesized by adjusting magnitudes of vectors along other two of the three positioning lines.

The position/posture detection unit 80 may include the linear sensor 82. The linear sensor 82 faces the floating unit 10 along a sensing line that intersects the transport line TL and detects the relative displacement along the transport line TL of the floating unit 10 with respect to the moving base 50.

For example, the linear sensor 82 is fixed to an upper surface of a portion of the bottom plate 51 between the end edge 51c and the first actuator 71, and faces the first positioning target 31 from below along a vertical sensing line L21 orthogonal to the transport line TL. The linear sensor 82 detects the displacement of the first positioning target 31 along the array line L01 (positioning line) that is parallel to the transport line TL.

For example, the linear sensor 82 is a magnetostrictive sensor and includes a magnetostrictive line along the array line L01. The linear sensor 82 detects the displacement of the first positioning target 31 based on the torsional strain generated in the magnetostrictive line by the magnets of the first positioning target 31.

The position/posture detection unit 80 may include the gap sensor 83*a*. The gap sensor 83*a* faces the floating unit 10 along a second sensing line that intersects (for example, is orthogonal to) the transport line TL and detects the distance from the moving base 50 to the floating unit 10.

The position/posture detection unit 80 may further include the gap sensor 83*b*. The gap sensor 83*b* faces the floating unit 10 along a third sensing line that intersects (for example, is orthogonal to) the transport line TL and the second sensing line to detect the distance from the moving base 50 to the floating unit 10.

The gap sensor 83*a* may be provided to face the floating unit 10 from below. For example, the gap sensor 83*a* is fixed to an upper surface of a portion of the bottom plate 51 between the end edge 51*d* and the first actuator 71, and faces the second positioning target 32 from below along a vertical sensing line L22 orthogonal to the transport line TL. The gap sensor 83*a* detects the distance to the second positioning target 32 along the sensing line L22 (positioning line).

The gap sensor 83*b* may be provided so as to face the floating unit 10 from a direction opposite to a direction in which the robot 3 is disposed with respect to the linear transport device 2. For example, the gap sensor 83*b* is fixed to the inner surface of the portion of the side plate 52 between the end edge 52*a* and the second actuator 72 and faces the fifth positioning target 35 along a horizontal a sensing line L23 (third sensing line) that is perpendicular to the transport line TL. The gap sensor 83*b* detects the distance to the fifth positioning target 35 along the sensing line L23 (positioning line).

The position/posture detection unit 80 may further include gap sensors 83*c*, 83*d*, 83*e*. The gap sensors 83*c*, 83*d* may be provided so as to face the floating unit 10 from below.

For example, the gap sensor 83*c* is fixed to the upper surface of the portion of the bottom plate 51 between the end edge 51*c* and the third actuator 73 and faces the third positioning target 33 from below along a vertical sensing line L24 (second sensing line) that is perpendicular to the transport line TL. The gap sensor 83*c* detects the distance to the third positioning target 33 along the sensing line L24 (positioning line).

The gap sensor 83*d* is fixed to the upper surface of the bottom plate 51 between the end edge 51*d* and the third actuator 73 and faces the fourth positioning target 34 from below along a vertical sensing line L25 (second sensing line) that is perpendicular to the transport line TL. The gap sensor 83*d* detects the distance to the fourth positioning target 34 along the sensing line L25 (positioning line).

The gap sensor 83*e* may be provided so as to face the floating unit 10 from a direction opposite to a direction in which the robot 3 is disposed with respect to the linear transport device 2. For example, the gap sensor 83*e* is fixed to the inner surface of the portion of the side plate 52 between the end edge 52*b* and the second actuator 72 and faces the sixth positioning target 36 along a horizontal sensing line L26 (third sensing line) that is perpendicular to the transport line TL. The gap sensor 83*e* detects the distance to the sixth positioning target 36 along the sensing line L26 (positioning line).

For example, the gap sensors 83*a*, 83*b*, 83*c*, 83*d*, 83*e* are eddy-current type sensors. The eddy-current type sensor includes a coil that generates a magnetic flux at a high frequency, and detects a distance to the positioning target based on an impedance change of the coil in accordance with an eddy current generated in a conductive member of the positioning target.

The housing 90 houses the moving base 50, the base drive unit 60, the non-contact force generation unit 70, and the position/posture detection unit 80, and divides an internal space 94 (first space) in which the moving base 50 moves and an external space 95 (second space) in which the floating unit 10 moves. In the internal space 94, dust may be generated by the linear guides 62, 63 or the like, but since the generated dust is retained in the internal space 94 by the housing 90, the external space 95 is kept clean.

The housing 90 includes a dividing wall 91 made of a non-magnetic material such as reinforced plastic. The dividing wall 91 partitions the internal space 94 and the external space 95 between the floating unit 10 and the moving base 50. The dividing wall 91 may include a first partition wall 92 and a second partition wall 93.

The first partition wall 92 partitions between the first actuator 71 and the third actuator 73 and the floating unit 10. The first actuator 71 applies the first non-contact force F01 and the first intersecting non-contact force F11 to the first mover 21 via the first partition wall 92. The third actuator 73 applies the third non-contact force F03 and the third intersecting non-contact force F13 to the third mover 23 via the first partition wall 92.

The first partition wall 92 also partitions between the linear sensor 82 and the gap sensors 83*a*, 83*c*, 83*d* and the floating unit 10. The linear sensor 82 detects displacement of the first positioning target 31 via the first partition wall 92. The gap sensor 83*a* detects the distance to the second positioning target 32 via the first partition wall 92. The gap sensor 83*c* detects the distance to the third positioning target 33 via the first partition wall 92. The gap sensor 83*d* detects the distance to the fourth positioning target 34 via the first partition wall 92.

The second partition wall 93 stands on the first partition wall 92 to partition between the second actuator 72 and the floating unit 10. The second actuator 72 applies the second non-contact force F02 and the second intersecting non-contact force F12 to the second mover 22 via the second partition wall 93. The second partition wall 93 also partitions between the gap sensors 83*b*, 83*e* and the floating unit 10. The gap sensor 83*b* detects the distance to the fifth positioning target 35 via the second partition wall 93, and the gap sensor 83*e* detects the distance to the sixth positioning target 36 via the second partition wall 93.

Figure 6:
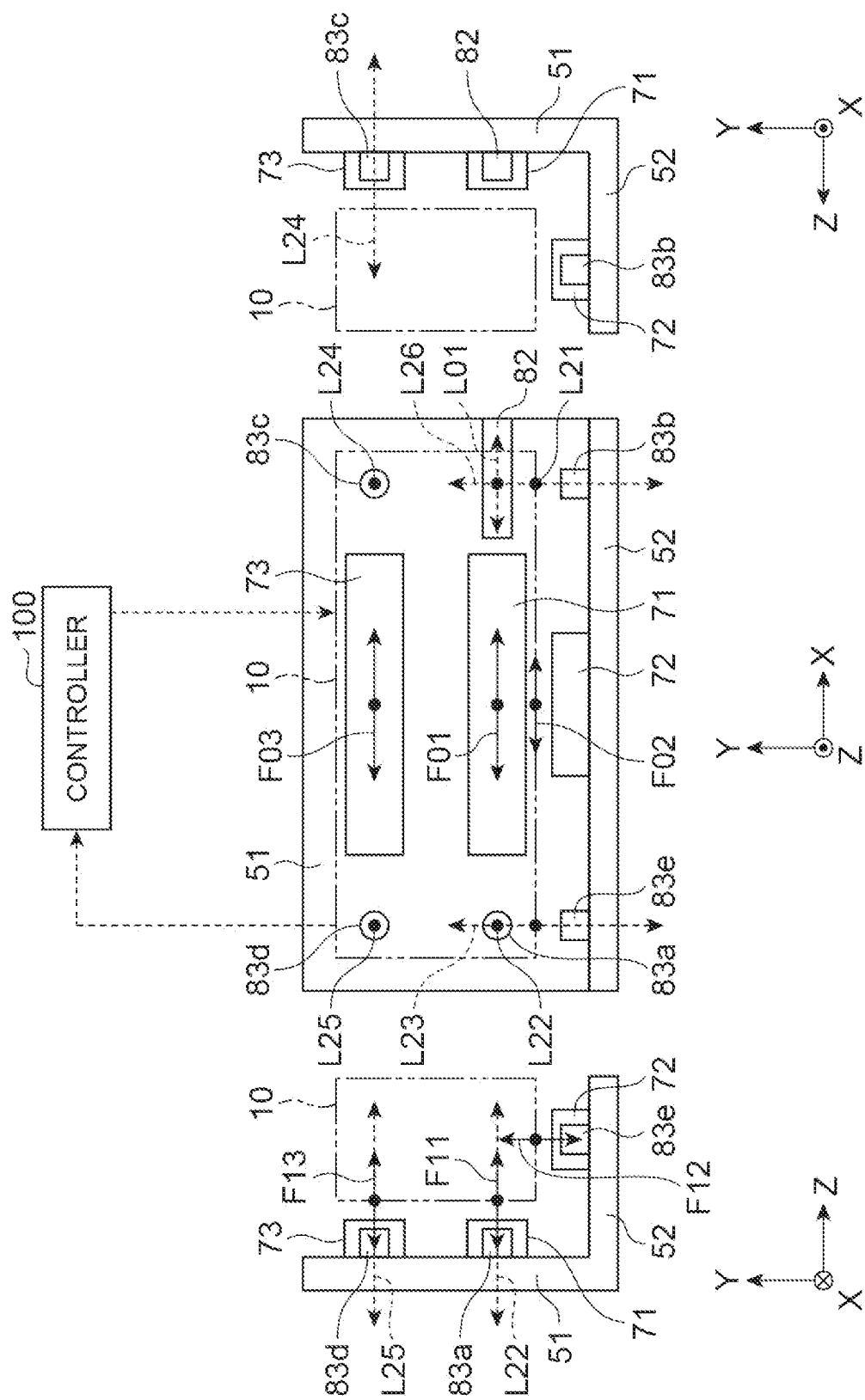
FIG. 6 is a schematic diagram summarizing a non-contact force and a positioning line.

FIG. 6 is a schematic diagram summarizing the non-contact force and the positioning line. As illustrated in FIG. 6, the drive unit 40 applies six independent first non-contact force F01, second non-contact force F02, third non-contact force F03, first intersecting non-contact force F11, second intersecting non-contact force F12, and third intersecting non-contact force F13 to the floating unit 10. All of the relative position of the floating unit 10 (relative position with respect to the moving base 50) on the X-axis in the figure along the transport line TL, the relative position of the floating unit 10 on the vertical Z-axis, the relative position of the floating unit 10 on the Y-axis perpendicular to the X-axis and Z-axis, the relative posture of the floating unit 10 (relative posture with respect to the moving base 50) around the X-axis, the relative posture of the floating unit 10 around the Y-axis, and the relative posture of the floating unit 10 around the Z-axis may be changed.

For example, by changing the sum of the first non-contact force F01, the second non-contact force F02 and the third non-contact force F03, the relative position of the floating unit 10 on the X-axis can be changed. By changing the sum of the first intersecting non-contact force F11 and the third intersecting non-contact force F13, the relative position of the floating unit 10 on the Z-axis can be changed. By changing the first intersecting non-contact force F11, the second intersecting non-contact force F12, and the third intersecting non-contact force F13, the relative position of the floating unit 10 on the Y-axis can be changed.

By changing the relationship between the first intersecting non-contact force F11 and the third intersecting non-contact force F13, the relative posture of the floating unit 10 around the X-axis can be changed. By changing the relationship between the first non-contact force F01, the second non-contact force F02, and the third non-contact force F03, the relative posture of the floating unit 10 around the Y-axis can be changed. By changing the relationship between the first non-contact force F01 and the third non-contact force F03, the relative posture of the floating unit 10 around the Z-axis can be changed.

The drive unit 40 also detects the relative displacement (relative displacement with respect to the moving base 50) of the floating unit 10 along six positioning lines independent of each other. All of the relative displacement of the floating unit 10 in the X-axis, the relative displacement of the floating unit 10 in the Z-axis, the relative displacement of the floating unit 10 in the Y-axis, the relative rotation of the floating unit 10 around the X-axis, the relative rotation of the floating unit 10 around the Y-axis, and the relative rotation of the floating unit 10 around the Z-axis may be detected.

For example, relative displacement in the X-axis can be detected based on relative displacement along the array line L01 (positioning line). Based on the relative displacement along sensing lines L22, L24, L25 (positioning line), the relative displacement in the Z-axis can be detected. Based on the relative displacement along sensing lines L23, L26, the relative displacement in the Y-axis can be detected.

The relative posture around the X-axis and the relative posture around the Y-axis can be detected based on the relationship between the relative displacement along the sensing line L22, the relative displacement along the sensing line L24, and the relative displacement along the sensing line L25. The relative posture about the Z-axis can be detected based on the relationship between relative displacement along the sensing line L23 and relative displacement along the sensing line L26.

The configuration of the drive unit 40 for generating six non-contact forces independent of each other is not limited to the configuration described above. An infinite number of configurations for generating six non-contact forces independent of each other are conceivable.

Figure 7:
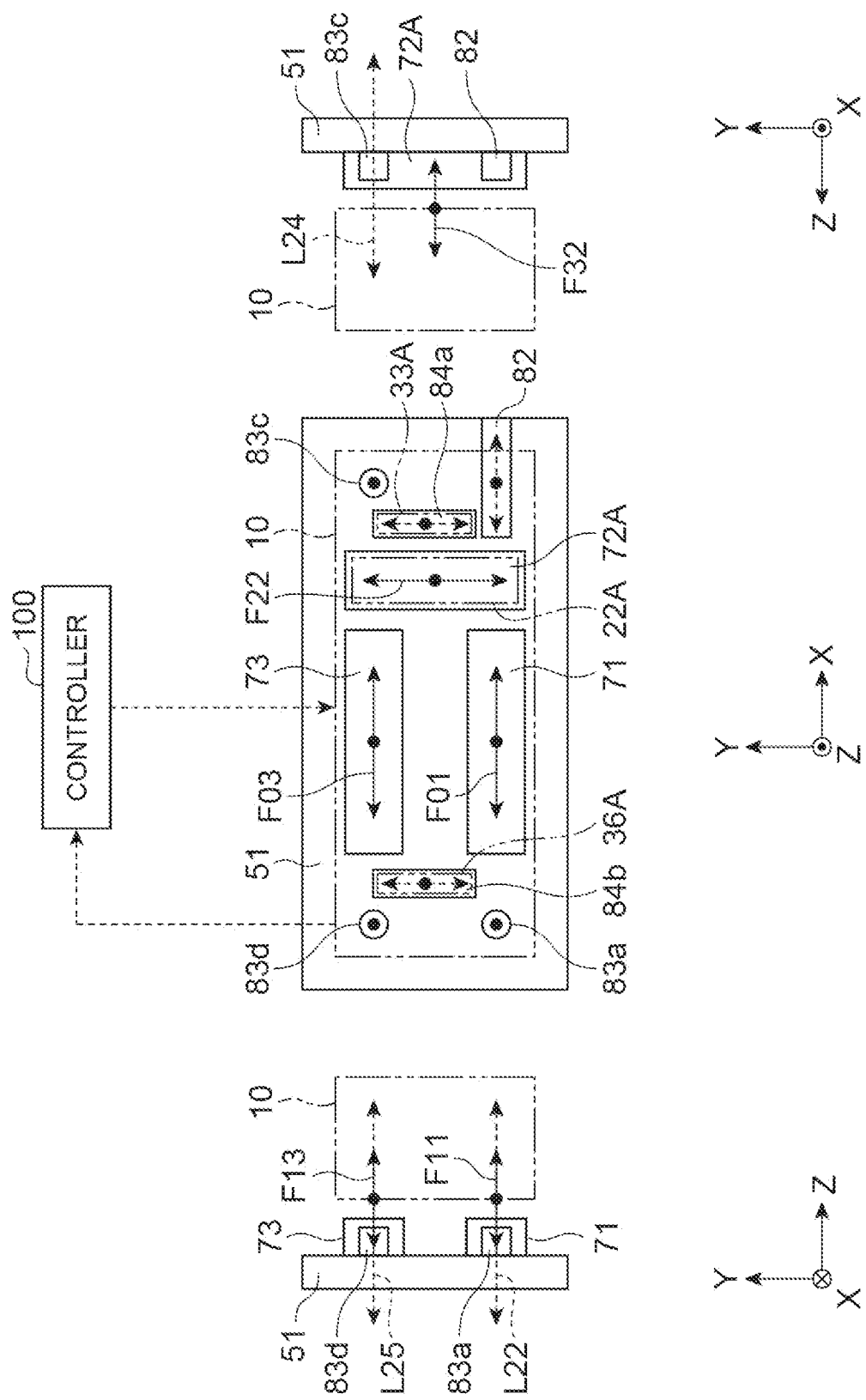
FIG. 7 is a schematic diagram illustrating a modified example of a non-contact force generation unit and a position/posture detection unit.

As an example, FIG. 7 illustrates a configuration in which the second mover 22 provided in the side frame 12 and the second actuator 72 provided in the side plate 52 in the above-described configuration are replaced with a second mover 22A provided in the bottom frame 11 and a second actuator 72A provided in the bottom plate 51.

The second mover 22A is fixed to a lower surface of a portion of the bottom frame 11 closer to the end edge 11c.

The second actuator 72A is fixed to an upper surface of a portion of the bottom plate 51 closer to the end edge 51c, and is located below the second mover 22A. The second actuator 72A applies a second non-contact force F22 along the Y-axis to the second mover 22A of the floating unit 10. The second actuator 72A also applies a second intersecting non-contact force F32 along the Z-axis to the second mover 22A of the floating unit 10.

With this configuration, all of the relative position of the floating unit 10 on the X-axis, the relative position of the floating unit 10 on the Z-axis, the relative position of the floating unit 10 on the Y-axis, the relative posture of the floating unit 10 around the X-axis, the relative posture of the floating unit 10 around the Y-axis, and the relative posture of the floating unit 10 around the Z-axis may be changed.

The configuration of the drive unit 40 for detecting the relative displacement of the floating unit 10 in the six positioning lines independent from each other is not limited to the example configuration described above. There are number of configurations for detecting the relative displacement of the floating unit 10 in the six positioning lines independent of each other.

As an example, FIG. 7 illustrates a configuration in which the third positioning target 33 and the sixth positioning target 36 provided in the side frame 12 and the gap sensors 83b, 83e provided in the side plate 52 in the above-described configuration are replaced with a third positioning target 33A and a sixth positioning target 36A provided in the bottom frame 11 and linear sensors 84a and 84b provided in the bottom plate 51.

The third positioning target 33A is fixed to the lower surface of the portion of the bottom frame 11 between the end edge 11c and the second mover 22A. The sixth positioning target 36A is fixed to the lower surface of the bottom frame 11 between the end edge 11d and the first mover 21 and the third mover 23.

The linear sensor 84a is fixed to the upper surface of the bottom plate 51 between the end edge 51c and the second actuator 72A. A linear sensor 84b is fixed to the upper surface of the bottom plate 51 between the end edge 51d and the first actuator 71 and the second actuator 72. The linear sensor 84a detects the relative displacement of the third positioning target 33A in a positioning line perpendicular to the transport line TL and the vertical line. The linear sensor 84b detects the relative displacement of the sixth positioning target 36A in a positioning line perpendicular to the transport line TL and the vertical line.

With this configuration, all of the relative displacement of the floating unit 10 on the X-axis, the relative displacement of the floating unit 10 on the Z-axis, the relative displacement of the floating unit 10 on the Y-axis, the relative rotation of the floating unit 10 around the X-axis, the relative rotation of the floating unit 10 around the Y-axis, and the relative rotation of the floating unit 10 around the Z-axis may be detected. In the configuration of FIG. 7, the side frame 12 and the side plate 52 can be omitted. The second partition wall 93 located between the side frame 12 and the side plate 52 may also be omitted.

The controller 100 (force control unit) controls a non-contact force generated by the non-contact force generation unit 70 based on the relative position of the floating unit 10 with respect to the moving base 50. For example, the controller 100 controls the non-contact force generated by the non-contact force generation unit 70 based on at least the detection result from the linear sensor 82.

The controller 100 may control the non-contact force generated by the non-contact force generation unit 70 based on at least the detection result of the linear sensor 82 and the detection result of the gap sensor 83a. For example, the controller 100 may control the non-contact force generated by the non-contact force generation unit 70 based on a detection result of the linear sensor 82 and detection results by the gap sensors 83*a*, 83*b*, 83*c*, 83*d*, 83*e*.

Figure 8:
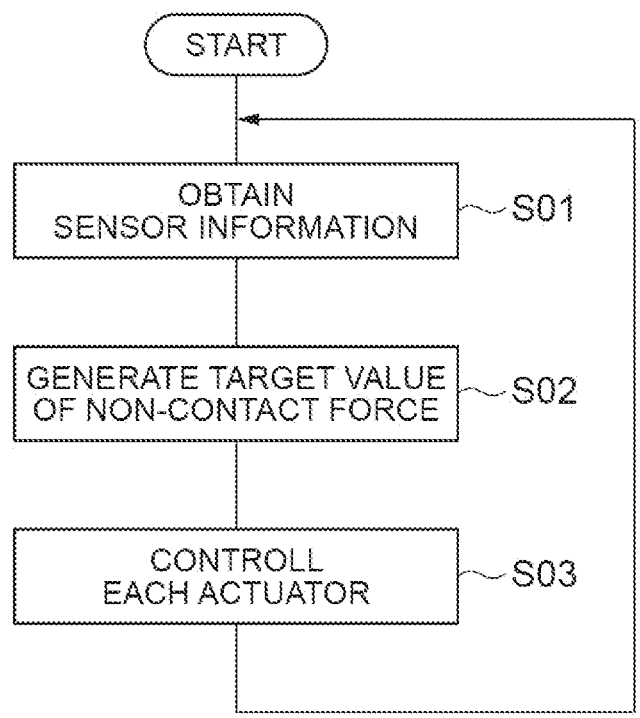
FIG. 8 is a flowchart illustrating an example force control procedure.

FIG. 8 is a flowchart illustrating a force control procedure by the controller 100. As illustrated in FIG. 8, the controller 100 executes operations S01, S02, and S03. Operation S01 includes obtaining a detection result by the position/posture detection unit 80. Operation S02 includes generating target values of six non-contact force so that the detection result of position/posture detection unit 80 approaches the target relative position and the target relative posture of the floating unit 10 with respect to the moving base 50. Operation S03 includes controlling the first actuator 71, the second actuator 72, and the third actuator 73 so that the six non-contact forces are respectively adjusted to the target values. The controller 100 repeats the above procedure at a predetermined control cycle.

Figure 9:
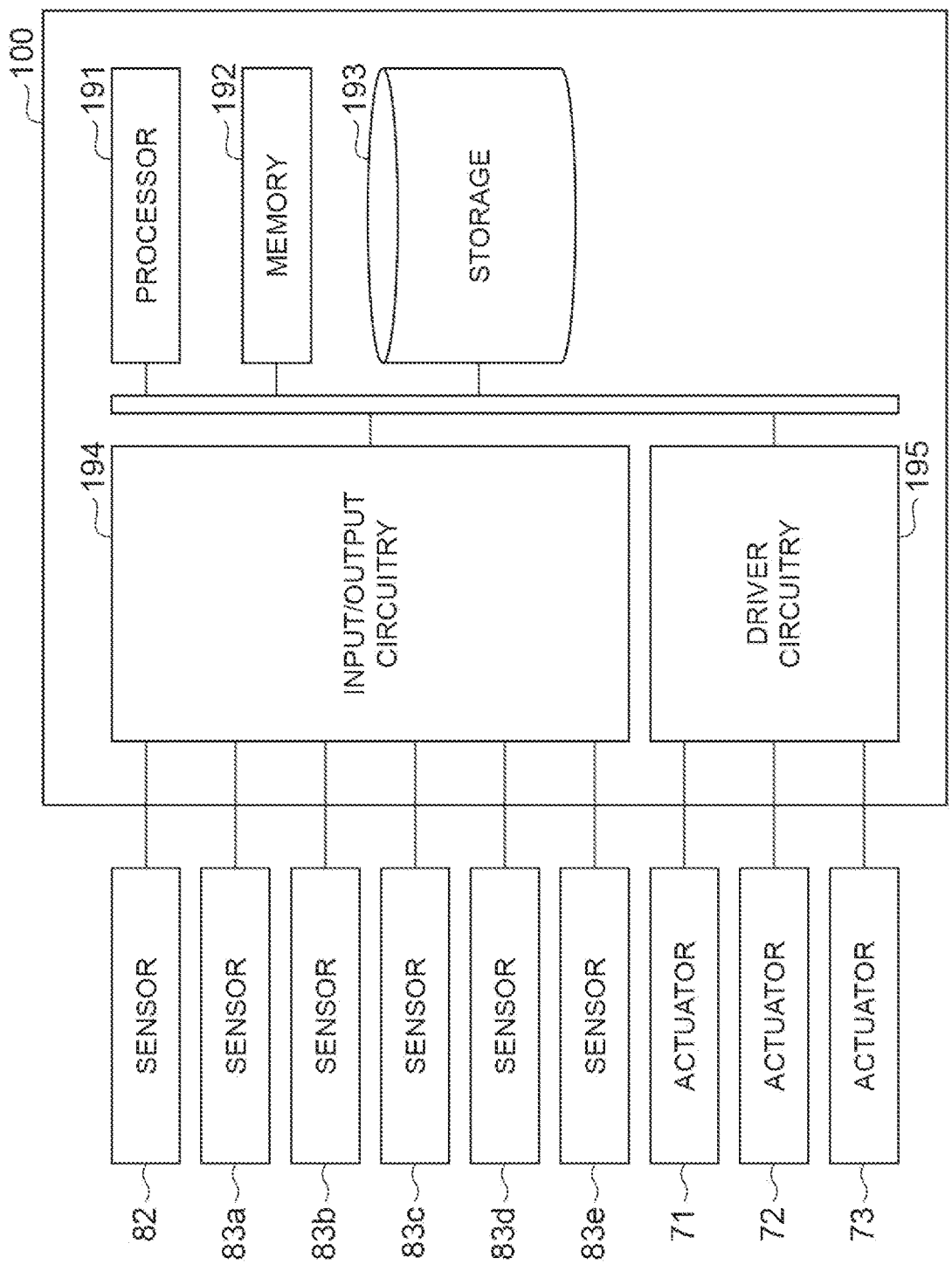
FIG. 9 is a diagram illustrating an example hardware configuration of a controller.

FIG. 9 is a diagram illustrating an example hardware configuration of the controller 100. As illustrated in FIG. 9, the controller 100 includes at least one processor 191, a memory 192, storage 193, input/output circuitry 194, and driver circuitry 195. The storage 193 includes a computer-readable storage medium, such as a nonvolatile semiconductor memory. The storage 193 stores control programs for the linear transport device 2 and the robot 3. The control program includes a program that causes the controller 100 to change three or more non-contact forces to the non-contact force generation unit 70 based on the detection result of the position/posture detection unit 80.

The memory 192 temporarily stores the program loaded from the storage medium of the storage 193 and the calculation result by the processor 191. The processor 191 executes the program in cooperation with the memory 192. The input/output circuitry 194 inputs and outputs electrical signals to and from the linear sensor 82 and the gap sensors 83*a*, 83*b*, 83*c*, 83*d*, 83*e* in accordance with instructions from the processor 191. The driver circuitry 195 outputs drive electric power to the first actuator 71, the second actuator 72, and the third actuator 73 in accordance with commands from the processor 191.

As described above, the substrate transport system 1 includes: the linear transport device 2 configured to transport the substrate W along the transport line TL; and the robot configured to receive the substrate W from the linear transport device 2, load the substrate W into the processing unit PU, unload the substrate W from the processing unit PU, and deliver the substrate W to the linear transport device 2. The linear transport device 2 includes: the moving base 50 (first moving body) configured to move along the transport line TL; the floating unit 10 (second moving body) configured to support the substrate W; and the non-contact force generation unit 70 configured to apply a non-contact force to the floating unit 10 from the moving base 50 so as to cause the floating unit 10 to follow movement of the moving base 50 while levitating the floating unit 10 with respect to the moving base 50.

A transport device that moves a floating moving body in a non-contact manner while floating the moving body may prevent dust emission. However, since the position and posture of the floating moving body are likely to vary, it may be difficult to achieve both transportation accuracy and dust emission control. For example, a non-contact force acting on the moving body may vary depending on the position of the moving body, and transportation accuracy may be reduced due to this.

On the other hand, in this the substrate transport system 1, a non-contact force is generated between the moving base 50 moving along the transport line TL and the floating unit 10 moving so as to follow the moving base 50. The relative displacement amount of the floating unit 10 with respect to the moving base 50 remains within a minute range with respect to the movement amount of the moving base 50 in the transport path. Therefore, the fluctuation of the non-contact force in accordance with the relative position of the floating unit 10 with respect to the moving base 50 can be substantially ignored. Accordingly, accuracy of the relative position of the floating unit 10 with respect to the moving base 50 may readily be maintained while levitating the floating unit 10 with respect to the moving base 50.

Since the floating unit 10 floats with respect to the moving base 50, a space in which the floating unit 10 moves and a space in which the moving base 50 moves can be partitioned. In the space in which the moving base 50 moves, the positional accuracy is prioritized over the dust emission control, and the positional accuracy of the moving base 50 can be increased. Therefore, both transportation accuracy and dust emission control may be achieved.

The linear transport device may include the dividing wall 91 that divides the internal space 94 (first space) in which the moving base 50 moves and the external space 95 (second space) in which the floating unit 10 moves. A configuration in which the floating unit 10 floats with respect to the moving base 50 may further prevent the dust emission.

The non-contact force generation unit 70 may include: the first actuator 71 that faces the floating unit 10 along the intersecting line L11 (first intersecting line) intersecting the transport line TL and is configured to apply a non-contact force to the floating unit 10; and the second actuator 72 that faces the floating unit 10 along the intersecting line L12 intersecting the transport line TL and the intersecting line L11 and is configured to apply a non-contact force to the floating unit 10. An arrangement space for the actuators may readily be secured by causing the first actuator 71 and the second actuator 72 to face each other from different directions.

The first actuator 71 may be configured to apply the first non-contact force F01 parallel to the transport line TL to the floating unit 10. The second actuator 72 may be configured to apply the second non-contact force F02 parallel to the transport line TL to the floating unit 10. Since the non-contact force parallel to the transport line TL is doubly applied, the positioning accuracy of the floating unit 10 along the transport line TL can be improved.

The first actuator 71 may be configured to further apply the first intersecting non-contact force F11 along the intersecting line L11 to the floating unit 10. The second actuator 72 may further apply the second intersecting non-contact force F12 along the intersecting line L12 to the floating unit 10. Since the first actuator 71 and the second actuator 72 are also used for floating, the structure can be simplified.

The first actuator 71 and the second actuator 72 may be linear motors configured to displace the floating unit 10 along the transport line TL. The positioning accuracy can be further improved.

The substrate transport system 1 may further have the third actuator 73 that faces the floating unit 10 along the intersecting line L13 (third intersecting line) that intersects the intersecting line L12 and is parallel to the intersecting line L11, and be configured to apply a non-contact force to the floating unit 10. The positioning accuracy can be further improved.

The third actuator 73 may be configured to apply the third non-contact force F03 parallel to the transport line TL to the floating unit 10. The positioning accuracy of the floating unit 10 along the transport line TL can be further improved.

The third actuator 73 may be configured to further apply the third intersecting non-contact force F13 along the intersecting line L13 (third intersecting line) to the floating unit 10. Since the third actuator 73 is also used for floating, the structure can be simplified.

The first actuator 71 and the third actuator 73 may face the floating unit 10 from below, and the second actuator 72 may face the floating unit 10 from a direction opposite to the direction in which the robot 3 is disposed with respect to the linear transport device 2. Gravity can also be used for adjusting the posture of the floating unit 10.

The non-contact force generation unit 70 may be configured to generate six non-contact forces independent of each other between the moving base 50 and the floating unit 10. Stability of the relative position of the floating unit 10 with respect to the moving base 50 can be improved.

The substrate transport system 1 may further include the controller 100 (force control unit) configured to control the non-contact force generated by the non-contact force generation unit 70 based on the relative position of the floating unit 10 with respect to the moving base 50. The substrate may be more accurately transferred to and from the robot 3 by controlling the non-contact force based on the relative position.

The substrate transport system 1 may further include the linear sensor 82 that faces the floating unit 10 along the sensing line L21 intersecting the transport line TL and be configured to detect a relative displacement of the floating unit 10 with respect to the moving base 50 along the transport line TL, and the controller 100 may be configured to control the non-contact force generated by the non-contact force generation unit 70 based on at least the detection result of the linear sensor 82. The relative displacement of the floating unit 10 along the transport line TL can be accurately detected without interfering with the movement of the floating unit 10 along the transport line TL.

The substrate transport system 1 may further include the gap sensors 83*a*, 83*c*, 83*d* that face the floating unit 10 along the sensing lines L22, L24, L25 (second sensing line) intersecting the transport line TL and be configured to detect the distance from the moving base 50 to the floating unit 10. The controller 100 may be configured to control the non-contact force generated by the non-contact force generation unit 70 based on at least the detection result of the linear sensor 82 and the detection result of the gap sensors 83*a*, 83*c*, 83*d*. The device configuration can be simplified by using the gap sensors 83*a*, 83*c*, 83*d* for the displacement in the direction intersecting the transport line TL.

The substrate transport system 1 may further include the gap sensors 83*b*, 83*e* (second gap sensor) that face the floating unit 10 along the sensing lines L23, L26 intersecting the transport line TL and the sensing lines L22, L24, L25, and be configured to detect the distance from the moving base 50 to the floating unit 10. The device configuration may further be simplified by using the gap sensors 83*a*, 83*b*, 83*c*, 83*d*, 83*e* for each of the relative displacements in two directions intersecting each other.

It is to be understood that not all aspects, advantages and features described herein may necessarily be achieved by, or included in, any one particular example. Indeed, having described and illustrated various examples herein, it should be apparent that other examples may be modified in arrangement and detail.

What is claimed is:

1. A substrate transport system comprising:
   a linear transport device configured to transport a substrate along a transport line; and
   a robot configured to receive the substrate from the linear transport device, load the substrate into a processing unit, unload the substrate from the processing unit, and deliver the substrate to the linear transport device,
   wherein the linear transport device comprises:
      a first moving body configured to move along the transport line;
      a second moving body configured to support the substrate;
      a mover comprising three or more permanent magnets fixed to the second moving body and arranged in a parallel direction to the transport line; and
      a non-contact force generator comprising three or more coils fixed to the first moving body and arranged in the parallel direction,
   wherein the three or more coils are configured to generate a moving magnetic field that moves relative to the first moving body in the parallel direction, and
   wherein the moving magnetic field of the non-contact force generator applies a non-contact force to the mover in the parallel direction to cause the second moving body to follow movement of the first moving body in the parallel direction while the second moving body levitates with respect to the first moving body.

2. The substrate transport system according to claim 1, wherein the linear transport device further comprises a dividing wall that divides a first space in which the first moving body moves and a second space in which the second moving body moves.

3. The substrate transport system according to claim 1, wherein the non-contact force generator comprises:
   a first actuator that faces the second moving body along a first intersecting line intersecting the transport line and is configured to apply a first non-contact force to the mover in the parallel direction; and
   a second actuator that faces the second moving body along a second intersecting line intersecting the transport line and the first intersecting line and is configured to apply a second non-contact force to the mover in the parallel direction.

4. The substrate transport system according to claim 3, wherein the first actuator is further configured to apply a first intersecting non-contact force along the first intersecting line to the mover, and
   wherein the second actuator is further configured to apply a second intersecting non-contact force along the second intersecting line to the mover.

5. The substrate transport system according to claim 4, wherein each of the first actuator and the second actuator is a linear motor configured to displace the second moving body relative to the first moving body along the transport line.

6. The substrate transport system according to claim 4, wherein the mover comprises:
   a first mover fixed to the second moving body, wherein the first actuator faces the first mover along the first intersecting line and is configured to apply the first non-contact force on the first mover; and
   a second mover fixed to the second moving body, wherein the second actuator faces the second mover along the second intersecting line and is configured to apply the second non-contact force on the second mover.

7. The substrate transport system according to claim 6, wherein the first mover comprises a first set of magnets including three or more permanent magnets arranged along a first magnet array line parallel to the transport line, wherein the first actuator comprises a first set of coils including three or more coils arranged along a first coil array line parallel to the transport line and is configured to generate a first magnetic field that moves along the first magnet array line, wherein the second mover comprises a second set of magnets including three or more permanent magnets arranged along a second magnet array line parallel to the transport line, wherein the second actuator comprises a second set of coils including three or more coils arranged along a second coil array line parallel to the transport line, and wherein the second set of coils is configured to generate a second magnetic field that moves relative to the first moving body along the second magnet array line.

8. The substrate transport system according to claim 4, further comprising a third actuator that faces the second moving body along a third intersecting line that intersects the second intersecting line and is parallel to the first intersecting line, and is configured to apply a third non-contact force to the mover in the parallel direction.

9. The substrate transport system according to claim 8, wherein the third actuator is further configured to apply a third intersecting non-contact force along the third intersecting line to the mover, and wherein the second moving body levitates by the first intersecting non-contact force and the third intersecting non-contact force.

10. The substrate transport system according to claim 9, wherein the first actuator and the third actuator face the second moving body from below, and wherein the second actuator faces the second moving body so that the second moving body is located between the second actuator and the robot along the second intersecting line.

11. The substrate transport system according to claim 1, wherein the non-contact force generator is configured to generate six non-contact forces independent of each other between the first moving body and the second moving body.

12. The substrate transport system according to claim 1, further comprising circuitry configured to control the non-contact force generator based on a relative position of the second moving body with respect to the first moving body.

13. The substrate transport system according to claim 12, wherein the circuitry is further configured to control the non-contact force generator so that the relative position of the second moving body approaches a pre-determined target position.

14. The substrate transport system according to claim 13, further comprising a linear sensor that faces the second moving body along a sensing line intersecting the transport line and is configured to detect a relative displacement of the second moving body with respect to the first moving body along the transport line, wherein the circuitry is configured to control the non-contact force generator based at least in part on a detection result of the linear sensor.

15. The substrate transport system according to claim 14, further comprising a gap sensor that faces the second moving body along a second sensing line intersecting the transport line and is configured to detect a distance from the first moving body to the second moving body, wherein the circuitry is configured to control the non-contact force generator based at least in part on the detection result of the linear sensor and a detection result of the gap sensor.

16. The substrate transport system according to claim 15, further comprising a second gap sensor that faces the second moving body along a third sensing line intersecting the transport line and the second sensing line, and is configured to detect a distance from the first moving body to the second moving body.

17. A substrate transport device comprising:
a first moving body configured to move along a transport line;
a second moving body configured to support a substrate;
a mover comprising three or more permanent magnets fixed to the second moving body and arranged in a parallel direction to the transport line;
a first actuator comprising a first set of coils arranged along the parallel direction and configured to generate a first magnetic field that moves relative to the first moving body in the parallel direction; and
a second actuator comprising a second set of coils arranged along the parallel direction and configured to generate a second magnetic field that moves relative to the first moving body in the parallel direction,
wherein the first moving magnetic field and the second moving magnetic field apply a first non-contact force and a second non-contact force to the mover in the parallel direction to cause the second moving body to follow movement of the first moving body in the parallel direction while the second moving body levitates with respect to the first moving body.

18. The substrate transport device according to claim 17, wherein the first actuator is further configured to apply a first intersecting non-contact force along the first intersecting line to the mover,
wherein the second actuator is further configured to apply a second intersecting non-contact force along the second intersecting line to the mover, and
wherein the first intersecting non-contact force and the second intersecting non-contact force cause the second moving body to levitate relative to the first moving body.

19. The substrate transport device according to claim 17, further comprising:
one or more sensors configured to detect a position of the second moving body with respect to the first moving body; and
circuitry configured to control the non-contact force generator to maintain a relative position of the second moving body with respect to the first moving body based, at least in part, on the position detected by the one or more sensors.

20. The substrate transport system according to claim 1, wherein the three or more coils are further configured to apply an intersecting non-contact force to the mover so that the second moving body levitates relative to the first moving body.

* * * * *